(12) United States Patent
Bryant et al.

(10) Patent No.: US 7,102,166 B1
(45) Date of Patent: Sep. 5, 2006

(54) HYBRID ORIENTATION FIELD EFFECT TRANSISTORS (FETS)

(75) Inventors: Andres Bryant, Burlington, VT (US); William F. Clark, Jr., Essex Junction, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/907,942

(22) Filed: Apr. 21, 2005

(51) Int. Cl.
H01L 29/04 (2006.01)
H01L 27/12 (2006.01)

(52) U.S. Cl. .............. 257/64; 257/66; 257/67; 257/69; 257/347; 257/365; 257/627; 257/628; 257/E21.561; 438/149; 438/479; 438/517

(58) Field of Classification Search ........ 257/347, 257/365, 627–628, 66–67, 64, 69, E21.561; 438/149, 479, 517
See application file for complete search history.

(56) References Cited

U.S. PATENT DOCUMENTS

| | | | |
|---|---|---|---|
| 5,289,027 A | 2/1994 | Terrill et al. | |
| 5,942,781 A | 8/1999 | Burr et al. | |
| 6,100,567 A * | 8/2000 | Burr | 257/365 |
| 6,281,551 B1 | 8/2001 | Chan et al. | |
| 6,391,752 B1 | 5/2002 | Colinge et al. | |
| 6,534,819 B1 | 3/2003 | Tiwari et al. | |
| 6,580,137 B1 | 6/2003 | Parke | |
| 6,603,453 B1 | 8/2003 | Yamazaki et al. | |
| 6,686,630 B1 | 2/2004 | Hanafi et al. | |
| 6,913,964 B1 * | 7/2005 | Hsu | 438/239 |
| 2003/0209761 A1 | 11/2003 | Yagishita et al. | |
| 2004/0046207 A1 | 3/2004 | Dennard et al. | |
| 2004/0046208 A1 | 3/2004 | Dennard et al. | |
| 2004/0195646 A1 * | 10/2004 | Yeo et al. | 257/527 |

OTHER PUBLICATIONS

Yang, et al., "Back-Gated CMOS and SOIAS for Dynamic Threshold Voltage Control," IEEE Transactions on Electron Devices, vol. 44, No. 5, pp. 822-831, May 1997.

* cited by examiner

Primary Examiner—Jerome Jackson
Assistant Examiner—Joseph Nguyen
(74) Attorney, Agent, or Firm—Schmeiser, Olsen & Watts; William D. Sabo

(57) ABSTRACT

A hybrid orientation semiconductor structure and method of forming the same. The structure includes (a) a semiconductor substrate comprising a first semiconductor material having a first lattice orientation; (b) a back gate region on the semiconductor substrate; (c) a back gate dielectric layer on the back gate region; (d) a semiconductor region on the back gate dielectric layer, wherein the semiconductor region is electrically insulated from the back gate region by the back gate dielectric layer, and wherein the semiconductor region comprises a second semiconductor material having a second lattice orientation different from the first lattice orientation; and (e) a field effect transistor (FET) formed on the semiconductor region, wherein changing a voltage potential applied to the back gate region causes a change in a threshold voltage of the FET.

20 Claims, 5 Drawing Sheets

HYBRID ORIENTATION FIELD EFFECT TRANSISTORS (FETS)

BACKGROUND OF THE INVENTION

1. Technical Field

The present invention relates to field effect transistors (FETs), and more specifically, to hybrid orientation FETs.

2. Related Art

Dopant fluctuations are becoming a serious problem in Vt (threshold voltage) control in advanced semiconductor devices. As semiconductor devices become smaller and smaller in size, Vt control becomes more difficult. Hybrid orientation field effect transistors (FETs) have the same problems. As a result, there is a need for a hybrid orientation semiconductor structure (and methods for forming the same) that allows for Vt control.

SUMMARY OF THE INVENTION

The present invention provides a semiconductor structure, comprising (a) a semiconductor substrate comprising a first semiconductor material having a first lattice orientation; (b) a back gate region on the semiconductor substrate; (c) a back gate dielectric layer on the back gate region; (d) a semiconductor region on the back gate dielectric layer, wherein the semiconductor region is electrically insulated from the back gate region by the back gate dielectric layer, and wherein the semiconductor region comprises a second semiconductor material having a second lattice orientation different from the first lattice orientation; and (e) a field effect transistor (FET) formed on the semiconductor region, wherein changing a voltage potential applied to the back gate region causes a change in a threshold voltage of the FET.

The present invention also provides a semiconductor structure fabrication method, comprising providing a semiconductor structure, wherein the semiconductor structure includes (a) a semiconductor substrate comprising a first semiconductor material having a first lattice orientation, (b) a back gate dielectric layer on the semiconductor substrate, and (c) a semiconductor region on the back gate dielectric layer, wherein the semiconductor region comprises a second semiconductor material having a second lattice orientation different from the first lattice orientation; and forming, in the semiconductor substrate, a back gate region beneath the back gate dielectric layer, wherein the back gate dielectric layer is sandwiched between and electrically insulates the back gate region and the semiconductor region.

The present invention also provides a hybrid orientation semiconductor structure (and methods for forming the same) that allows for Vt control.

DETAILED DESCRIPTION OF THE INVENTION

Figure 1:
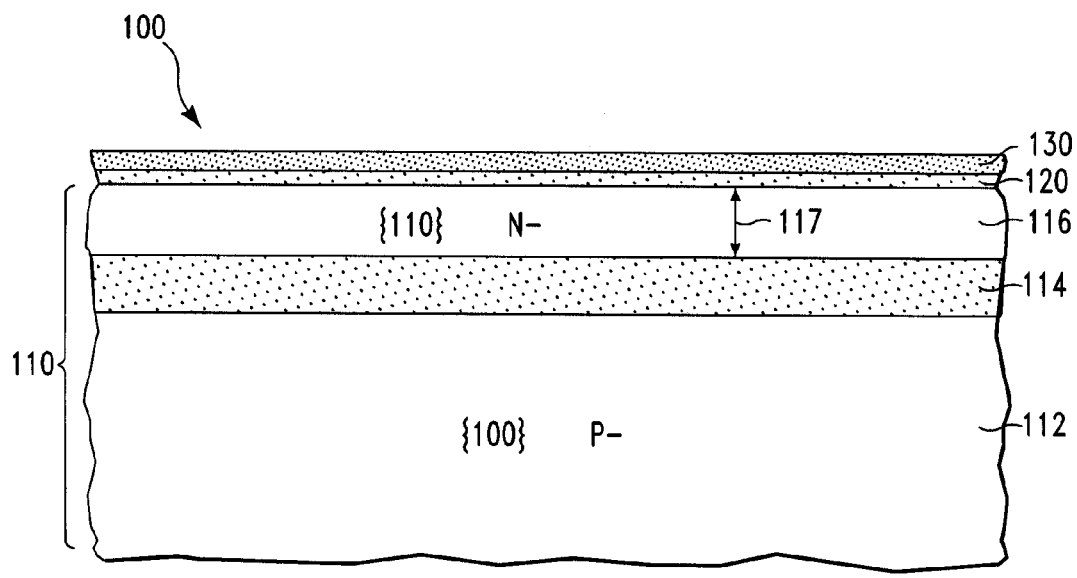
FIGS. 1–8 illustrate cross-section views of a hybrid orientation semiconductor structure going through different fabrication steps, in accordance with embodiments of the present invention.

FIGS. 1–8 illustrate cross-section views of a hybrid orientation semiconductor structure 100 going through different fabrication steps, in accordance with embodiments of the present invention. More specifically, with reference to FIG. 1, in one embodiment, the fabrication of the structure 100 starts out with a silicon on insulator (SOI) substrate 110. The SOI substrate 110 comprises a bottom silicon layer 112, a buried oxide (BOX) layer 114, and a top silicon layer 116.

The bottom silicon layer 112 is lightly doped P type (i.e., doped with P type dopants such as Boron atoms) and have lattice orientation {100}, whereas the top silicon layer 116 is lightly doped N type (i.e., doped with N type dopants such as phosphorous atoms) and have lattice orientation {110}. The minus signs in "P–" and "N–" as used in the figures indicate lightly doped. The BOX layer 114 comprises a dielectric material such as silicon dioxide.

Figure 9A:
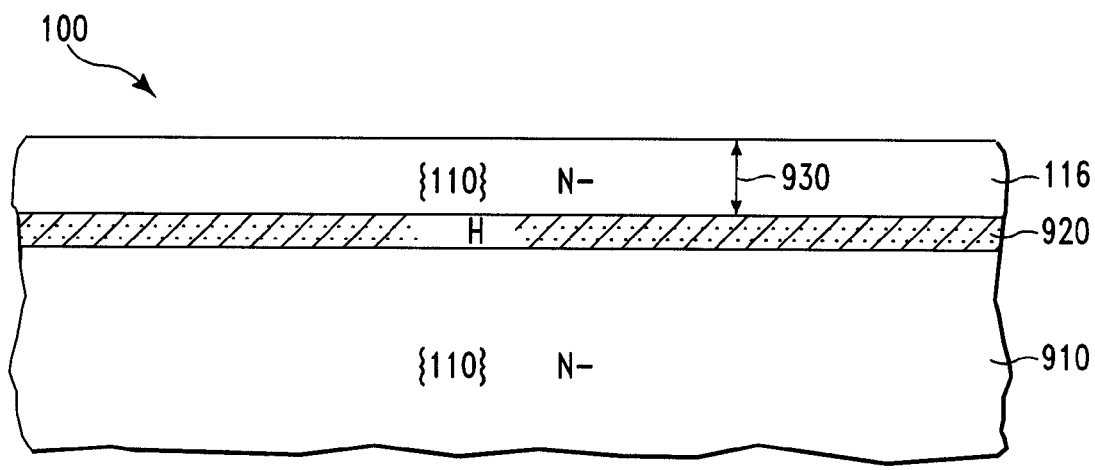
FIGS. 9A–9B illustrate the formation of an SOI substrate used to form the hybrid orientation semiconductor structure of FIGS. 1–8, in accordance with embodiments of the present invention.
Figure 9B:
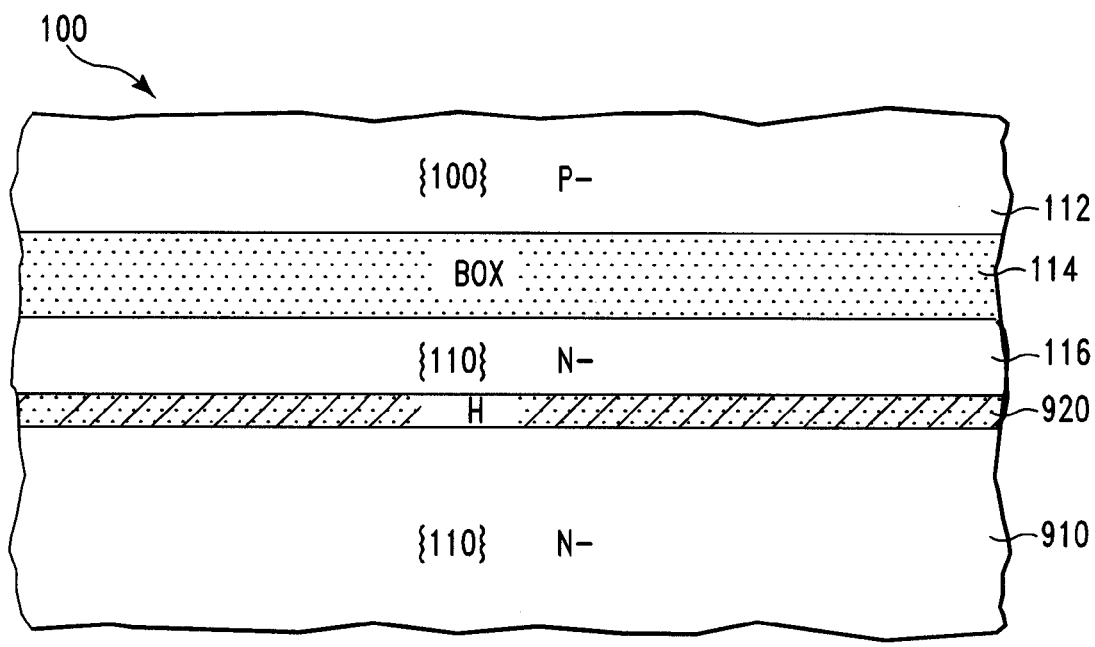

In one embodiment, the SOI substrate 110 is formed using a Smart-Cut process. FIGS. 9A–9B illustrate the formation of the SOI substrate 110 using the Smart-Cut process. With reference to FIG. 9A, the formation of the SOI substrate 110 starts out with a silicon substrate 910 being lightly doped N type and having lattice orientation {110}. Next, a hydrogen-damaged layer 920 is formed at a depth 930 which is equal to the desired thickness 117 of the top silicon layer 116 of FIG. 1. The hydrogen-damaged layer 920 is formed by hydrogen ion implantation.

Next, with reference to FIG. 9B, the BOX layer 114 is formed on top of the substrate 910 by, illustratively, chemical vapor deposition (CVD). Next, the bottom silicon layer 112 is formed on top of the BOX layer 114 by bonding. Next, the entire structure 110 of FIG. 9B is annealed so that implanted hydrogen in the hydrogen-damaged layer 920 forms a gas causing the structure 110 of FIG. 9B to split along the hydrogen-damaged layer 920. Next, the top part of the structure 110 of FIG. 9B after the split is turned upside down to be used as the SOI substrate 110 of FIG. 1.

Next, with reference again to FIG. 1, an oxide layer 120 is formed on top of the top silicon layer 116 by, illustratively, thermal oxidation. Next, a nitride layer 130 is formed on top of the oxide layer 120 by, illustratively, CVD.

Figure 2:
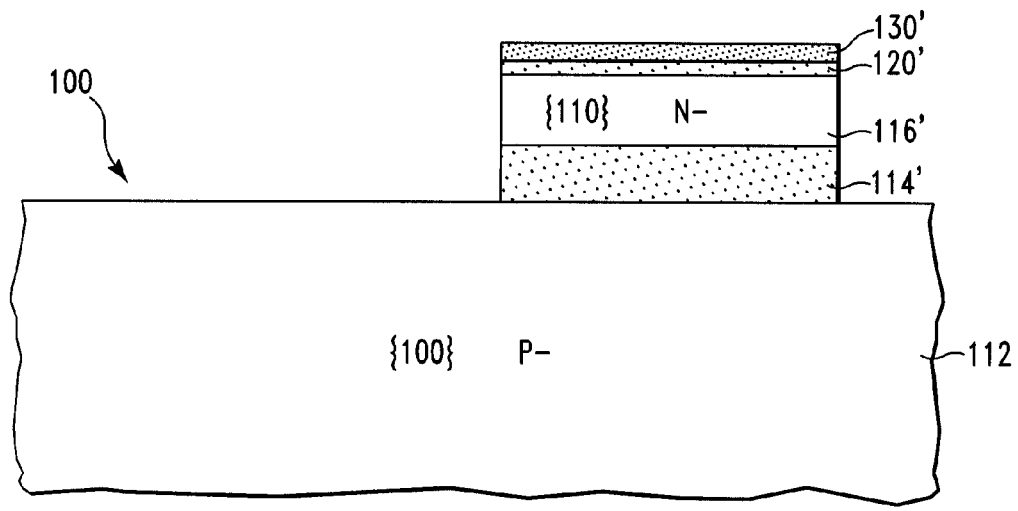

Next, with reference to FIG. 2, in one embodiment, etching steps are performed to etch through the layers 130, 120, 116, and 114 (FIG. 1) so as to form a stack 130', 120', 116', 114', using, illustratively, a lithography process. What are left of the layers 130, 120, 116, and 114 (FIG. 1) after the etching steps are performed are the regions 130', 120', 116', and 114', respectively. Also as a result of the etching steps, the bottom silicon layer 112 is exposed to the atmosphere.

Figure 3:
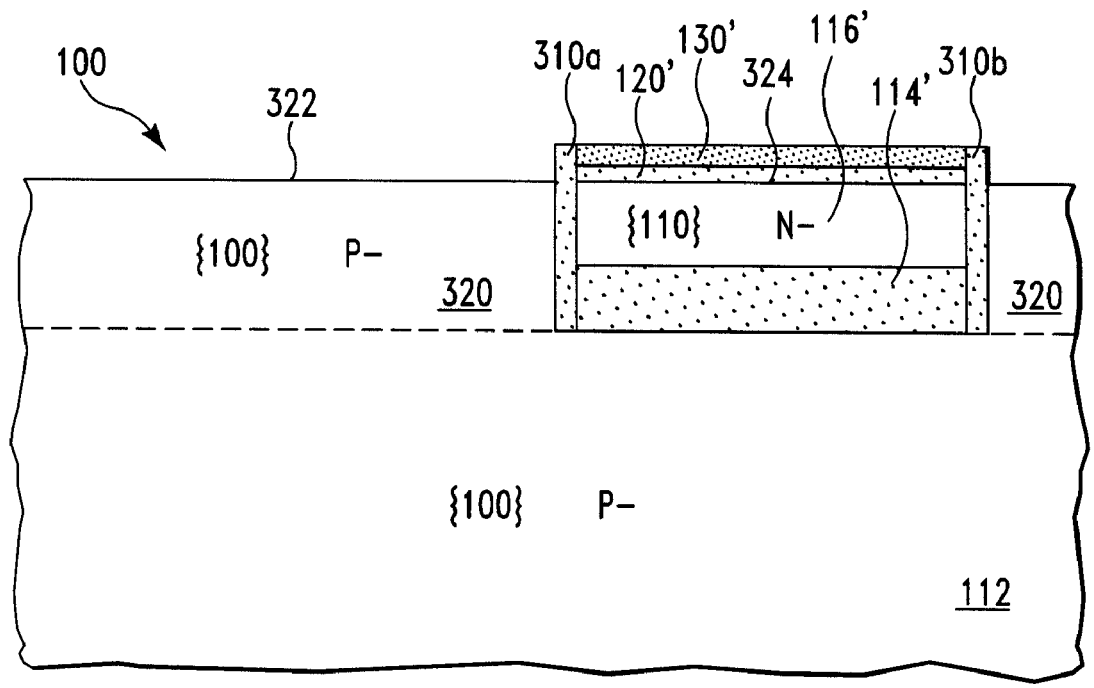

Next, with reference to FIG. 3, in one embodiment, side wall oxide spacers 310a and 310b are formed on side walls of the stack 130', 120', 116', 114'. In one embodiment, the side wall oxide spacers 310a and 310b are formed by depositing an oxide layer (not shown) on top of the entire structure 100 of FIG. 2 and then directionally etching back the oxide layer.

Figure 4:
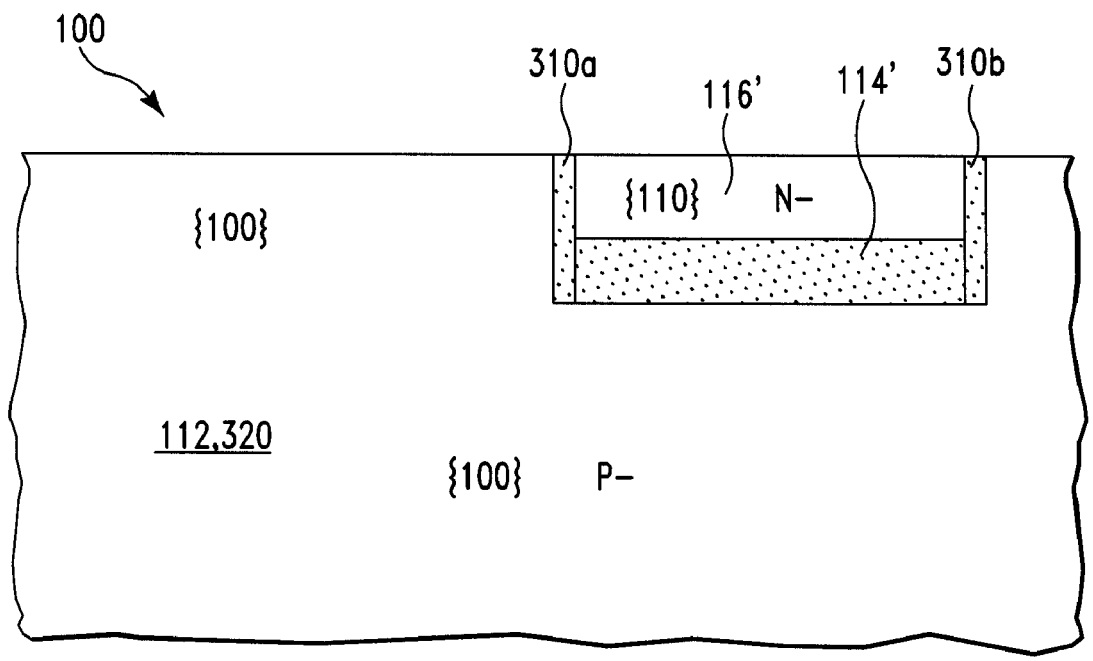

Next, P– silicon (i.e., silicon with P type dopants) is epitaxially grown on exposed-to-atmosphere surfaces of the bottom silicon layer 112 so as to form a silicon region 320. In one embodiment, the epitaxial growth is stopped when a top surface 322 of the silicon region 320 is essentially at the same level as a top surface 324 of the silicon region 116'. As a result of the epitaxial growth, the silicon region 320 has the same lattice orientation as that of the silicon layer 112 (i.e., {100}). Therefore, the silicon regions 112 and 320 can be collectively referred to as the substrate 112,320. Next, the nitride region 130' and the oxide region 120' are removed by, illustratively, wet etching steps. The resultant structure 100 is shown in FIG. 4. In an alternative embodiment, the silicon region 320 is epitaxially grown past (i.e., higher than) the top surface 324 of the silicon region 116', and then a chemical mechanical polishing (CMP) step is performed until the top surface 324 of the silicon region 116' is exposed to the surrounding ambient, resulting in the structure 100 of FIG. 4.

Figure 5:
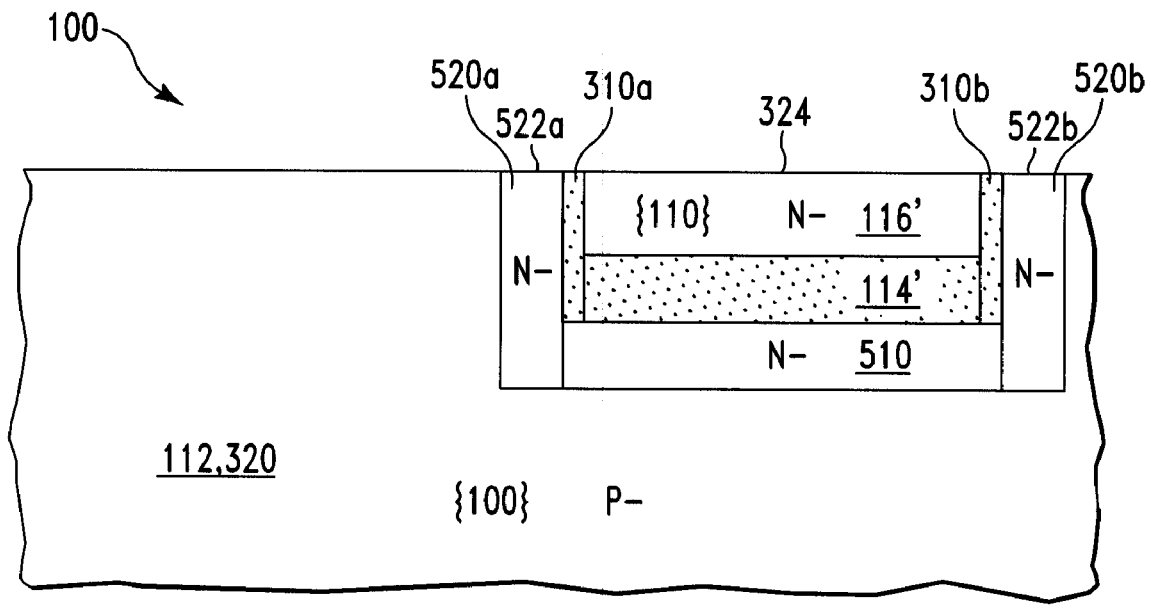

Next, with reference to FIG. 5, a back gate region 510 is formed in the substrate 112,312 and beneath the oxide region 114' (which can also be referred to as the back gate dielectric layer 114'. In one embodiment, the back gate region 510 is formed by lightly implanting N type dopants (i.e., impurities) in the substrate 112,312 by ion implantation.

Next, electrically coupling regions 520a and 520b are formed in the substrate 112,312 and in direct physical contact with the back gate region 510 so as to provide electrical access to the back gate region 510 from an upper interconnect level (not shown). In one embodiment, the electrically coupling regions 520a and 520b are formed by lightly implanting N type dopants in the substrate 112,312 by ion implantation. The electrically coupling regions 520a and 520b may have top surfaces 522a and 522b, respectively, essentially at the same level as the top surface 324 of the silicon region 116'.

Figure 6:
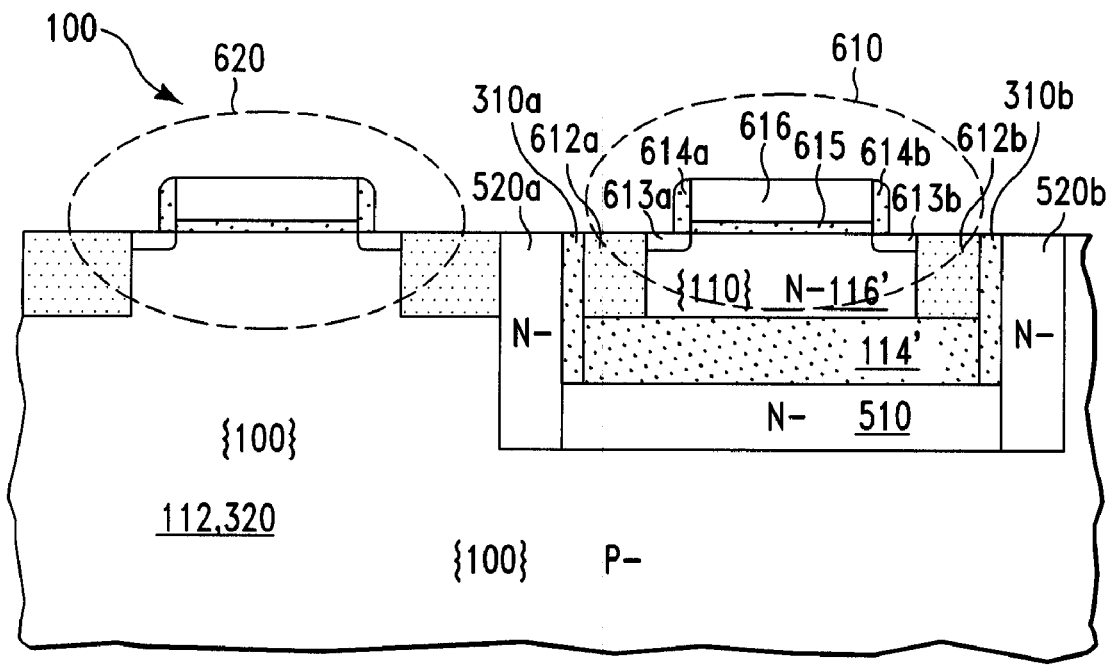

Next, with reference to FIG. 6, field effect transistors (FETs) 610 and 620 are formed on the silicon region 116' and on the substrate 112,312, respectively. In one embodiment, the FET 610 comprises shallow trench isolation regions 612a and 612b, source/drain regions 613a and 613b, gate spacers 614a and 614b, a main gate dielectric layer 615, and a main gate region 616. The FET 620 has a similar structure as that of the FET 610.

It should be noted that the FET 610 has the back gate region 510 which is electrically insulated from the silicon region 116' by the back gate dielectric layer 114'. The voltage potential of the back gate region 510 is controlled via either of (or both) the electrically coupling regions 520a and 520b so as to control the threshold voltage of the FET 610.

In one embodiment, the FET 610 is a P channel FET which has a higher operating speed when formed on {110} oriented silicon lattice than on {100} oriented silicon lattice. On the other hand, the FET 620 is an N channel FET which has a higher operating speed when formed on {100} oriented silicon lattice than on {110} oriented silicon lattice. The structure 100 of FIG. 6 has two lattice orientations {100} and {110}, hence the name the hybrid orientation structure 100.

In an alternative embodiment, with reference to FIG. 5, the back gate region 510 and the electrically coupling regions 520a and 520b are lightly doped P type (as opposed to doped N type as described in the above embodiments).

Figure 7:
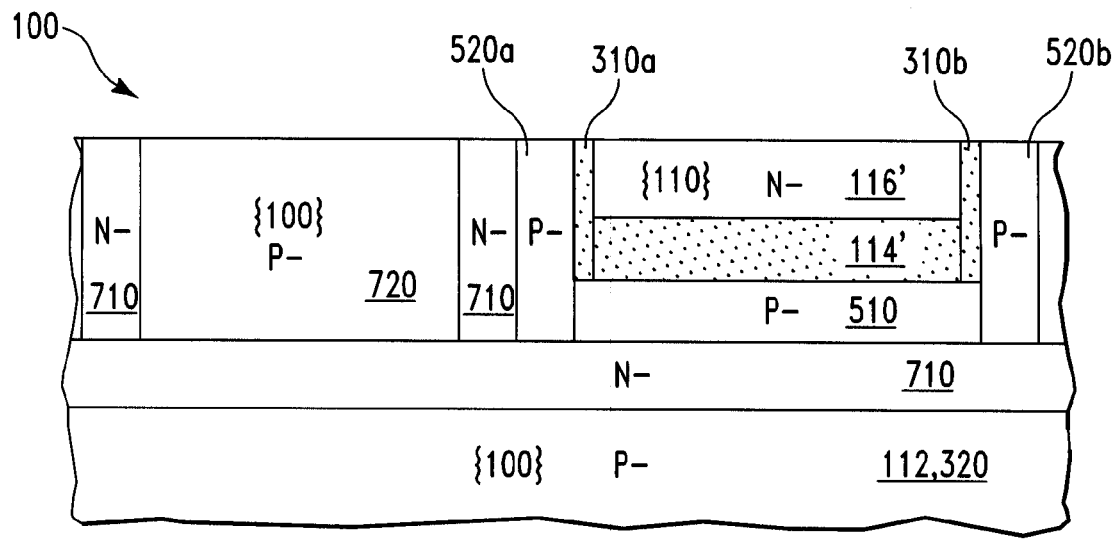

Next, with reference to FIG. 7, isolating region 710 is formed in the substrate 112,312 so as to physically isolate a device region 720 of the substrate 112,312.

Figure 8:
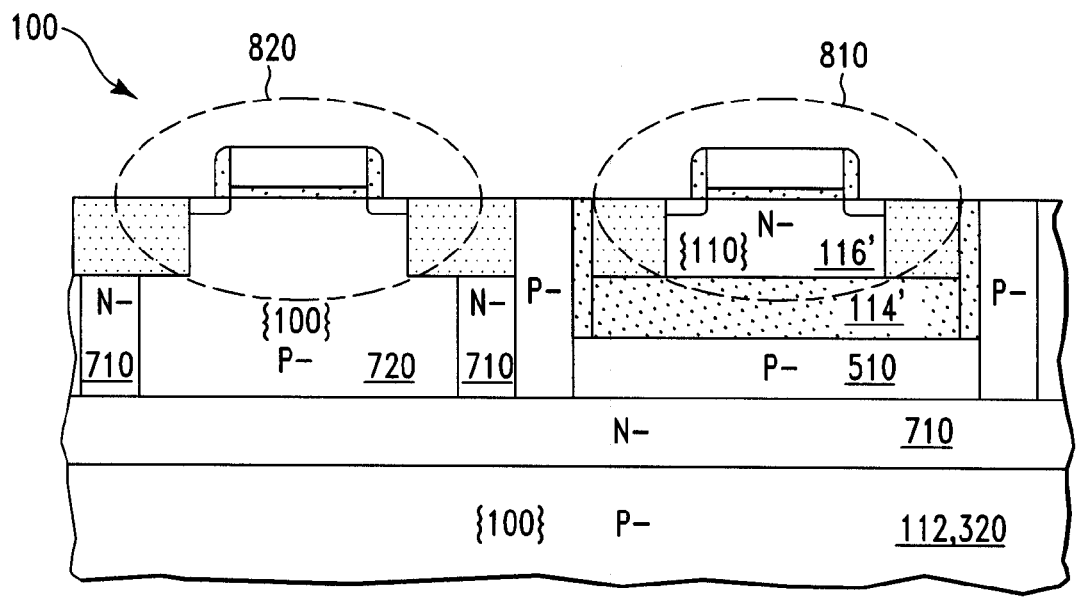

Next, with reference to FIG. 8, FETs 810 and 820, similar to the FETs 610 and 620 (FIG. 6), respectively, are formed on the silicon region 116' and the device region 720, respectively. It should be noted that the device region 720, which is physically isolated from the rest of the substrate 112,312 by the isolating region 710, is individually raised to a desired voltage potential so as to control the threshold voltage of the FET 820 without affecting the voltage potentials of other regions of the substrate 112,312.

In the embodiments described above, silicon is used in the layers 112 and 116 (FIG. 1). In general, other semiconductor materials (e.g., germanium) may be used.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A semiconductor structure, comprising:
    (a) a semiconductor substrate comprising a first semiconductor material having a first lattice orientation;
    (b) a back gate region on the semiconductor substrate;
    (c) a back gate dielectric layer on the back gate region;
    (d) a semiconductor region on the back gate dielectric layer, wherein the semiconductor region is electrically insulated from the back gate region by the back gate dielectric layer, and wherein the semiconductor region comprises a second semiconductor material having a second lattice orientation different from the first lattice orientation; and
    (e) a field effect transistor (FET) formed of the semiconductor region, wherein changing a voltage potential applied to the back gate region causes a change in a threshold voltage of the FET,
    wherein a first top surface of the semiconductor substrate and a second top surface of the semiconductor region are essentially coplanar.

2. The semiconductor structure or claim 1,
    wherein the first and second semiconductor materials comprise silicon,
    wherein the first lattice orientation is {100}, and
    wherein the second lattice orientation is {110}.

3. The semiconductor structure of claim 1,
    wherein the semiconductor substrate is doped P type,
    wherein the semiconductor region is doped N type, and
    wherein the back gate region is doped N type.

4. The semiconductor structure of claim 3, wherein the FET is a P channel FET.

5. The semiconductor structure of claim 1, wherein the semiconductor substrate comprises an electrically coupling region in direct physical contact with the back gate region, wherein the electrically coupling region comprises a third top surface being essentially at a same level as the second top surface of the semiconductor region.

6. The semiconductor structure of claim 5, wherein the electrically coupling region is doped N type.

7. The semiconductor structure of claim 1, wherein the back gate dielectric layer physically isolates the semiconductor region from the semiconductor substrate.

8. A semiconductor structure, comprising:
    (a) a semiconductor substrate comprising a first semiconductor material having a first lattice orientation;
    (b) a back gate region on the semiconductor substrate;
    (c) a back gate dielectric layer on the back gate region;
    (d) a semiconductor region on the back gate dielectric layer, wherein the semiconductor region is electrically insulated from the back gate region by the back gate dielectric layer, and wherein the semiconductor region comprises a second semiconductor material having a second lattice orientation different from the first lattice orientation; and
    (e) a field effect transistor (FET) formed on the semiconductor region, wherein changing a voltage potential applied to the back gate region causes a change in a threshold voltage of the FET, wherein the semiconductor substrate further comprises (i) a device region being doped P type and (ii) an isolating region being doped N type and in direct physical contact with the device region, wherein the isolating region physically isolates the device region from a remaining portion of the semiconductor substrate, wherein the remaining portion of the semiconductor substrate is doped P type, wherein the semiconductor region is doped N type, and wherein the back gate region is doped P type.

9. The semiconductor structure of claim 8, further comprising an N channel FET on the device region.

10. A semiconductor structure fabrication method, comprising:
providing a semiconductor structure, wherein the semiconductor structure includes:
(a) a semiconductor substrate comprising a first semiconductor material having a first lattice orientation,
(b) a back gate dielectric layer on the semiconductor substrate, and
(c) a semiconductor region on the back gate dielectric layer, wherein the semiconductor region comprises a second semiconductor material having a second lattice orientation different from the first lattice orientation; and
forming, in the semiconductor substrate, a back gate region beneath the back gate dielectric layer, wherein the back gate dielectric layer is sandwiched between and electrically insulates the back gate region and the semiconductor region,
wherein a first top surface of the semiconductor substrate and a second top surface of the semiconductor region are essentially coplanar.

11. The method of claim 10, wherein said forming the back gate region is performed by implanting dopants in the semiconductor substrate by ion implantation.

12. The method of claim 10, further comprising forming a P channel field effect transistor (FET) on the semiconductor region, wherein changing a voltage potential applied to the back gate region causes a change in a threshold voltage of the P channel FET.

13. The method of claim 10,
wherein the first and second semiconductor materials comprise silicon,
wherein the first lattice orientation is {100}, and
wherein the second lattice orientation is {110}.

14. The method of claim 10,
wherein the semiconductor substrate is doped P type,
wherein the semiconductor region is doped N type, and
wherein the back gate region is doped N type.

15. The method of claim 14, further comprising forming an N channel FET on the semiconductor substrate.

16. The method of claim 10, further comprising forming an electrically coupling region in direct physical contact with the back gate region, wherein the electrically coupling region comprises a third top surface being essentially at a same level as the second top surface of the semiconductor region.

17. The method of claim 16, wherein said forming the electrically coupling region is performed by implanting dopants in the semiconductor substrate by ion implantation.

18. The method or claim 10, wherein the back gate dielectric layer physically isolates the semiconductor region from the semiconductor substrate.

19. A semiconductor structure fabrication method, comprising;
providing a semiconductor structure, wherein the semiconductor structure includes:
(a) a semiconductor substrate comprising a first semiconductor material having a first lattice orientation,
(b) a back gate dielectric layer on the semiconductor substrate, and
(c) a semiconductor region on the back gate dielectric layer, wherein the semiconductor region comprises a second semiconductor material having a second lattice orientation different from the first lattice orientation;
forming, in the semiconductor substrate, a back gate region beneath the back gate dielectric layer, wherein the back gate dielectric layer is sandwiched between and electrically insulates the back gate region and the semiconductor region; and
forming an isolating region in the semiconductor substrate,
wherein the isolating region physically isolates a device region of the semiconductor substrate from a remaining region of the semiconductor substrate,
wherein the isolating region is doped N type,
wherein the device region is doped P type,
wherein the remaining portion of the semiconductor substrate is doped P type,
wherein the semiconductor region is doped N type, and
wherein the back gate region is doped P type.

20. The method of claim 19, further comprising forming an N channel FET on the device region.

* * * * *